(12) United States Patent
Abdelfattah Aly et al.

(10) Patent No.: US 12,057,812 B2
(45) Date of Patent: Aug. 6, 2024

(54) REDUCING RESISTOR CONDUCTIVITY MODULATION DURING AMPLIFICATION

(71) Applicant: Qualcomm Incorporated, San Diego, CA (US)

(72) Inventors: Khaled Mahmoud Abdelfattah Aly, Laguna Hills, CA (US); Chaoli Zhong, Shanghai (CN); Dongyang Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 357 days.

(21) Appl. No.: 17/597,989

(22) PCT Filed: Aug. 22, 2019

(86) PCT No.: PCT/CN2019/102017
§ 371 (c)(1),
(2) Date: Jan. 31, 2022

(87) PCT Pub. No.: WO2021/031194
PCT Pub. Date: Feb. 25, 2021

(65) Prior Publication Data
US 2022/0263471 A1    Aug. 18, 2022

(51) Int. Cl.
*H03F 1/02* (2006.01)
*H03F 3/45* (2006.01)
*H04R 3/00* (2006.01)

(52) U.S. Cl.
CPC ....... *H03F 1/0211* (2013.01); *H03F 3/45475* (2013.01); *H04R 3/00* (2013.01); *H03F 2200/03* (2013.01); *H04R 2420/07* (2013.01)

(58) Field of Classification Search
None
See application file for complete search history.

(56) References Cited

U.S. PATENT DOCUMENTS 6,049,473 A    4/2000  Jang et al.
8,081,785 B2 * 12/2011  Delano ................. H03F 3/68
                                                        381/370

(Continued)

FOREIGN PATENT DOCUMENTS

CN   103297057 A   9/2013
WO   2021031194 A  2/2021

OTHER PUBLICATIONS

International Search Report and Written Opinion—PCT/CN2019/102017—ISA/EPO—Apr. 24, 2020.

(Continued)

*Primary Examiner* — Paul W Huber
(74) *Attorney, Agent, or Firm* — Colby Nipper PLLC

(57) ABSTRACT

An apparatus is disclosed for reducing resistor conductivity modulation during amplification. In an example aspect, the apparatus includes a power amplifier circuit comprising a first pair of resistors, a digital-to-analog converter comprising a second pair of resistors, a reference generation circuit comprising a third pair of resistors, and a scaling circuit. The scaling circuit is configured to accept a common-mode reference voltage and a common-mode output voltage. The scaling circuit is also configured to provide a first voltage at body terminals of the first pair of resistors, a second voltage at body terminals of the second pair of resistors, and a third voltage at body terminals of the third pair of resistors such that a summation of the first voltage and the third voltage reduced by the second voltage is approximately equal to an average of the common-mode reference voltage and the common-mode output voltage.

30 Claims, 7 Drawing Sheets

(56) References Cited

U.S. PATENT DOCUMENTS

| | | |
|---|---|---|
| 9,467,100 B2 * | 10/2016 | Dhanasekaran ........ H03F 3/187 |
| 2003/0184380 A1 | 10/2003 | Mulder et al. |
| 2011/0018678 A1 | 1/2011 | Anjalbert |
| 2016/0226451 A1 * | 8/2016 | Vigraham ............. H03F 3/2173 |
| 2018/0233499 A1 | 8/2018 | Wen et al. |
| 2018/0269839 A1 | 9/2018 | Mehrabi et al. |

OTHER PUBLICATIONS

Anonymous: "Power Amplifier Classes—Wikipedia", Jun. 26, 2019, XP093036666, pp. 1-11.
Supplementary European Search Report—EP19942572—Search Authority—The Hague—Apr. 14, 2023, 14 pages.

* cited by examiner

600

```
┌─────────────────────────────────────────┐
│ Amplify, using a power amplifier circuit, an analog │
│ input signal to generate an amplified signal, the │
│ amplified signal comprising a common-mode output │
│ voltage, the power amplifier circuit comprising a │
│ first pair of resistors and a first differential amplifier │
│ connected to a common-mode reference voltage │
│ 602 │
└─────────────────────────────────────────┘
                    ↓
┌─────────────────────────────────────────┐
│ Generate, using a digital-to-analog converter, the │
│ analog input signal based on a digital input signal and │
│ differential reference voltages, the digital-to-analog │
│ converter comprising a second pair of resistors │
│ 604 │
└─────────────────────────────────────────┘
                    ↓
┌─────────────────────────────────────────┐
│ Generate, using a reference generation circuit, │
│ the differential reference voltages, the reference │
│ generation circuit comprising a third pair of │
│ resistors and a second differential amplifier │
│ connected to the common-mode reference voltage │
│ 606 │
└─────────────────────────────────────────┘
                    ↓
┌─────────────────────────────────────────┐
│ Provide a first voltage at body terminals of the first │
│ pair of resistors, a second voltage at body terminals │
│ of the second pair of resistors, and a third voltage at │
│ body terminals of the third pair of resistors such that │
│ a summation of the first voltage and the third voltage │
│ reduced by the second voltage is approximately │
│ equal to an average of the common-mode reference │
│ voltage and the common-mode output voltage │
│ 608 │
└─────────────────────────────────────────┘
```

FIG. 6

REDUCING RESISTOR CONDUCTIVITY MODULATION DURING AMPLIFICATION

CROSS-REFERENCE OF RELATED APPLICATIONS

This application is a National Stage Entry of and claims priority to International Patent Application No. PCT/CN2019/102017, filed on Aug. 22, 2019, the disclosure of which is incorporated by reference herein it its entirety.

TECHNICAL FIELD

This disclosure relates generally to audio circuitry and, more specifically, to biasing body terminals of resistors within the audio circuitry to reduce resistor conductivity modulation.

BACKGROUND

Many mobile devices include audio circuitry, which produces sounds users can hear. In particular, audio circuitry enables a user to listen to music, communicate with another person over a voice call, wake-up to an audible alarm, receive feedback during hands-free operation, and so forth. There is a growing trend to increase an output volume in the audio circuitry of mobile devices. A higher output volume enables a user to hear sounds from the mobile device at farther distances or in the presence of louder background noise. In some cases, the higher output volume can eliminate the need for connecting the mobile device to an external speaker. While it may be beneficial to increase a mobile device's output volume, there are several challenges associated with enabling the audio circuitry to produce the target output volume.

SUMMARY

An apparatus is disclosed that reduces resistor conductivity modulation during amplification. In particular, the apparatus includes audio circuitry with a power amplifier circuit, a digital-to-analog converter, a reference generation circuit, a scaling circuit, and a speaker. The power amplifier circuit, the digital-to-analog converter, and the reference generation circuit each include at least one pair of resistors. To increase the speaker's power efficiency, a supply voltage is modulated to track an envelope of the audio output, such as in a class-H fashion. A conditioned version of the same audio output can be coupled to the digital-to-analog converter's reference voltage to improve the audio circuitry's linearity. However, due to the conductivity modulation of the power amplifier's feedback resistors, the digital-to-analog converter's resistors, and the reference generation circuit's resistors, the total linearity of the audio circuitry can be severely impacted. The scaling circuit, however, provides respective voltages to body terminals of respective pairs of resistors to reduce the conductivity modulation relative to audio circuitry that does not include the scaling circuit. In particular, the scaling circuit provides a first voltage at the body terminals of a first pair of resistors within the power amplifier circuit, a second voltage at the body terminals of a second pair of resistors within the digital-to-analog converter, and a third voltage at the body terminals of a third pair of resistors within the reference generation circuit. The scaling circuit provides the first, second and third voltages such that a summation of the first voltage and the third voltage reduced by the second voltage is approximately equal to an average of a common-mode reference voltage, which is provided at the reference generation circuit and the power amplifier circuit, and a common-mode output voltage, which is provided at differential outputs of the power amplifier circuit. By reducing the conductivity modulation, the scaling circuit decreases the total harmonic distortion within the audio circuitry relative to audio circuitry that does not include the scaling circuit.

In an example aspect, an apparatus is disclosed. The apparatus includes a power amplifier circuit, a digital-to-analog converter, a reference generation circuit, and a scaling circuit. The power amplifier circuit comprises a first differential amplifier and a first pair of resistors. The first differential amplifier comprises a reference input and differential outputs. Respective resistors of the first pair of resistors are connected between respective differential inputs of the first differential amplifier and respective ones of the differential outputs of the first differential amplifier. The digital-to-analog converter comprises differential reference inputs and a second pair of resistors. Respective resistors of the second pair of resistors are connected to the respective differential inputs of the first differential amplifier and are selectively connected to the differential reference inputs. The reference generation circuit comprises a second differential amplifier and a third pair of resistors. The second differential amplifier comprises differential outputs and a reference input. The differential outputs are respectively connected to the differential reference inputs of the digital-to-analog converter. Respective resistors of the third pair of resistors are connected between respective differential inputs of the second differential amplifier and respective ones of the differential outputs of the second differential amplifier. The scaling circuit comprises a first input, a second input, a first output, a second output, and a third output. The first input is connected to both the reference input of the first differential amplifier and the reference input of the second differential amplifier and is configured to accept a common-mode reference voltage. The second input is connected to the differential outputs of the first differential amplifier and is configured to accept a common-mode output voltage. The first output is connected to body terminals of the first pair of resistors. The second output is connected to body terminals of the second pair of resistors. The third output is connected to body terminals of the third pair of resistors. The scaling circuit is configured to provide a first voltage at the first output, a second voltage at the second output, and a third voltage at the third output such that a summation of the first voltage and the third voltage reduced by the second voltage is approximately equal to an average of the common-mode reference voltage and the common-mode output voltage.

In an example aspect, an apparatus is disclosed. The apparatus includes a power amplifier circuit, a digital-to-analog converter, a reference generation circuit, and a scaling circuit. The power amplifier circuit comprises a first differential amplifier and a first pair of resistors. The first differential amplifier comprises a reference input and differential outputs. Respective resistors of the first pair of resistors are connected between respective differential inputs of the first differential amplifier and respective ones of the differential outputs of the first differential amplifier. The digital-to-analog converter comprises differential reference inputs and a second pair of resistors. Respective resistors of the second pair of resistors are connected to the respective differential inputs of the first differential amplifier and are selectively connected to the differential reference inputs. The reference generation circuit comprises a second differential amplifier and a third pair of resistors. The second differential amplifier comprises differential outputs and a reference input. The differential outputs are respectively connected to the differential reference inputs of the digital-to-analog converter. Respective resistors of the third pair of resistors are connected between respective differential inputs of the second differential amplifier and respective ones of the differential outputs of the second differential amplifier. The apparatus also includes scaling means for providing a first voltage at body terminals of the first pair of resistors, a second voltage at body terminals of the second pair of resistors, and a third voltage at body terminals of the third pair of resistors such that a summation of the first voltage and the third voltage reduced by the second voltage is approximately equal to an average of a common-mode reference voltage and a common-mode output voltage. The common-mode reference voltage is present at both the reference input of the first amplifier and the reference input of the second amplifier. The common-mode output voltage is present at the differential outputs of the first amplifier. The scaling means is connected to the reference input of the first amplifier, the reference input of the second amplifier, the differential outputs of the first amplifier, the body terminals of the first pair of resistors, the body terminals of the second pair of resistors, and the body terminals of the third pair of resistors.

In an example aspect, a method for reducing resistor conductivity modulation during amplification is disclosed. The method includes amplifying, using a power amplifier circuit, an analog input signal to generate an amplified signal. The amplified signal comprises a common-mode output voltage. The power amplifier circuit comprises a first pair of resistors and a first differential amplifier connected to a common-mode reference voltage. The method also includes generating, using a digital-to-analog converter, the analog input signal based on a digital input signal and differential reference voltages. The digital-to-analog converter comprises a second pair of resistors. The method additionally includes generating, using a reference generation circuit, the differential reference voltages. The reference generation circuit comprises a third pair of resistors and a second differential amplifier connected to the common-mode reference voltage. The method further includes providing a first voltage at body terminals of the first pair of resistors, a second voltage at body terminals of the second pair of resistors, and a third voltage at body terminals of the third pair of resistors such that a summation of the first voltage and the third voltage reduced by the second voltage is approximately equal to an average of the common-mode reference voltage and the common-mode output voltage.

In an example aspect, an apparatus is disclosed. The apparatus includes a power amplifier circuit, a boost circuit, a common-mode reference circuit, a digital-to-analog converter, a reference generation circuit, and a scaling circuit. The power amplifier circuit comprises a first differential amplifier and a first pair of resistors. The first differential amplifier comprises a reference input configured to accept a common-mode reference voltage. The first differential amplifier is configured to amplify an analog input signal to generate an amplified signal. The amplified signal comprises a common-mode output voltage. Respective resistors of the first pair of resistors are connected between respective differential inputs of the first differential amplifier and respective differential outputs of the first differential amplifier. The boost circuit is connected to a positive power terminal of the first differential amplifier and is configured to generate a supply voltage that varies based on the amplified signal. The common-mode reference circuit is connected to the positive power terminal of the first differential amplifier and the reference input of the first differential amplifier. The common-reference circuit is configured to generate the common-mode reference voltage based on the supply voltage. The digital-to-analog converter comprises differential reference inputs and a second pair of resistors. Respective resistors of the second pair of resistors are connected to the respective differential inputs of the first differential amplifier. The digital-to-analog converter is configured to generate the analog input signal by selectively connecting the respective resistors of the second pair of resistors to the differential reference inputs based on an input digital signal. The reference generation circuit comprises a second differential amplifier and a third pair of resistors. The second differential amplifier comprises a reference input configured to accept the common-mode reference voltage. The second differential amplifier is configured to generate the differential reference voltages. Respective resistors of the third pair of resistors are individually connected between respective differential inputs of the second differential amplifier and respective differential outputs of the second differential amplifier. The scaling circuit is connected to the common-mode reference voltage, the common-mode output voltage, body terminals of the first pair of resistors, body terminals of the second pair of resistors, and body terminals of the third pair of resistors. The scaling circuit is configured to provide a first voltage to the body terminals of the first pair of resistors, provide a second voltage to the body terminals of the second pair of resistors, and provide a third voltage to the body terminals of the second pair of resistors. At least one voltage of the first voltage, the second voltage, and the third voltage is based on at least one of the common-mode output voltage or the common-mode reference voltage.

BRIEF DESCRIPTION OF DRAWINGS

FIG. 5-1 illustrates an example scaling circuit that reduces resistor conductivity modulation during amplification.

FIG. 5-2 illustrates another example scaling circuit that reduces resistor conductivity modulation during amplification.

FIG. 6 is a flow diagram illustrating an example process for reducing resistor conductivity modulation during amplification.

DETAILED DESCRIPTION

Figure 1:
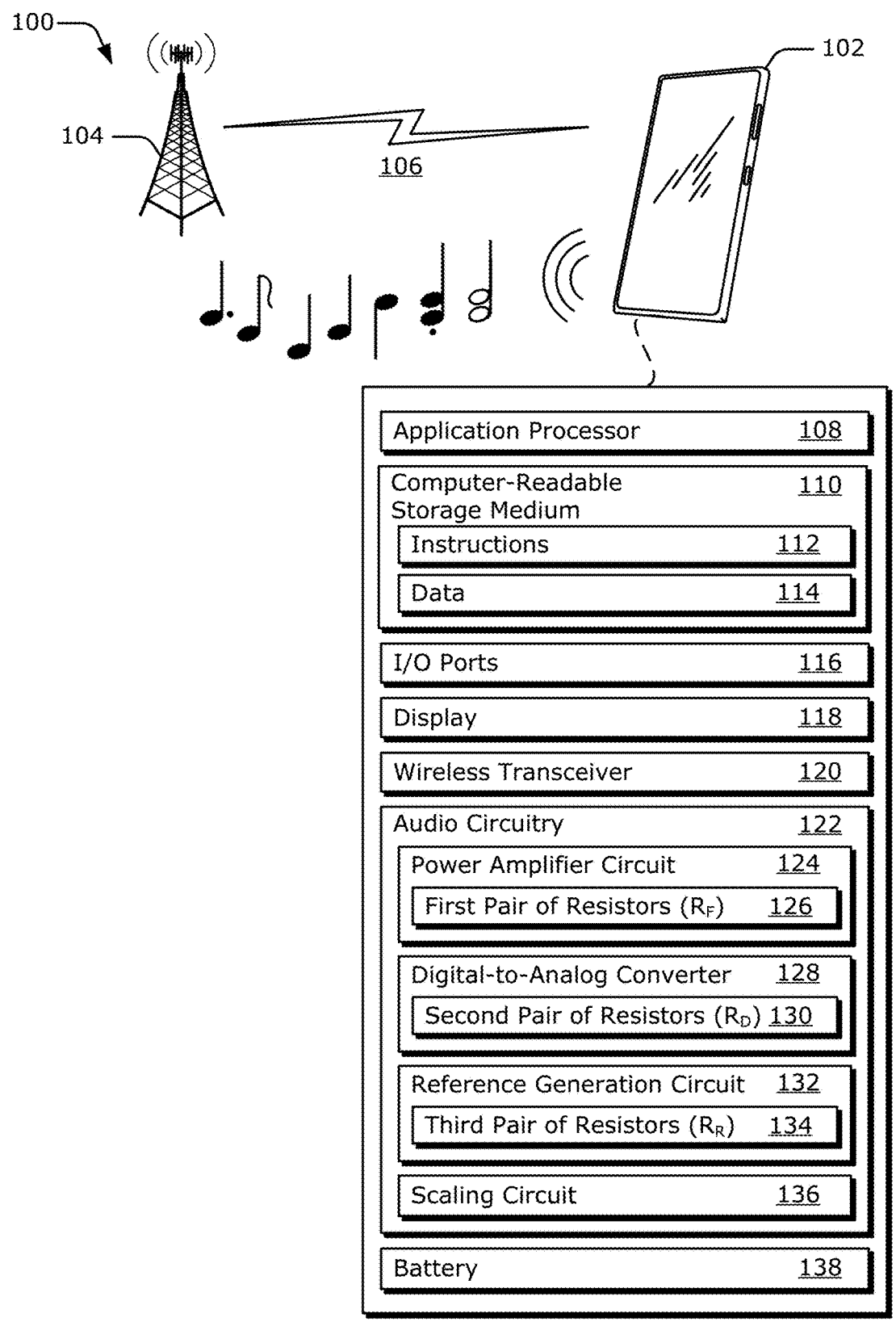
FIG. 1 illustrates an example computing device with audio circuitry that reduces resistor conductivity modulation during amplification.

While it may be beneficial to increase a mobile device's output volume, there are several challenges associated with enabling the mobile device's audio circuitry to produce the target output volume. One such problem is caused by a power amplifier's output power being dependent on a supply voltage. Some mobile device's include a Lithium-Ion (Li-Ion) battery, which can fit within space constraints of the mobile device and provide the supply voltage. An output voltage of the Li-Ion battery, however, may be unable to provide a sufficient amount of voltage to enable the power amplifier to achieve the target output volume.

To accommodate Li-Ion batteries, some audio circuitry includes a boost circuit to increase the voltage provided by the battery and provide this boosted voltage as the supply voltage for a power amplifier. While this technique can enable the audio circuitry to achieve the target output volume, an efficiency of the audio circuitry can decrease. To increase efficiency, the boost circuit varies the supply voltage as a function of the output signal produced by the power amplifier. Furthermore, to increase signal swing, a common-mode reference signal provided to the power amplifier is set to half of the supply voltage. Consequently, the common-mode reference signal is also dependent on the output signal of the power amplifier. This dependency, however, can exacerbate adverse effects of common-mode differential-mode (CM-DM) conversion resulting from mismatches in the power amplifier (e.g., mismatches in resistors due to process variations). Example adverse effects include increasing total harmonic distortion (THD) and degrading power-supply rejection-ratio (PSRR) performance of the audio circuitry.

To address these adverse effects, the common-mode reference signal derived from the power amplifier's output is coupled to the input of the power amplifier. This causes approximately the same common-mode signal to be present at the output of the amplifier and at the input of the amplifier at approximately the same time. Consequently, current due to the common-mode output voltage drops to near zero at the inputs of the power amplifier, which reduces CM-DM and associated distortions, even with mismatched resistors.

Enabling the supply voltage and/or the input signal of the power amplifier to vary as a function of the output signal introduces another non-ideal characteristic, conductivity modulation. In particular, the conductivity of resistors within the audio circuitry changes based on applied voltages at the resistors changing as a function of the output signal. Variations in the conductivity cause the resistors to behave in a non-linear fashion, which can increase total harmonic distortion in the power amplifier's output. Consequently, the harmonic distortion resulting from the conductivity modulation degrades the sound quality produced by the audio circuitry.

To ameliorate this harmonic distortion, techniques for reducing resistor conductivity modulation during amplification are described herein. An apparatus includes audio circuitry with a power amplifier circuit, a digital-to-analog converter, a reference generation circuit a scaling circuit, and a speaker. The power amplifier circuit, the digital-to-analog converter, and the reference generation circuit each include at least one pair of resistors. To increase the speaker's power efficiency, a supply voltage is modulated to track an envelope of the audio output, such as in a Class-H fashion. A conditioned version of the same audio output can be coupled to the digital-to-analog converter's reference voltage to improve the audio circuitry's linearity. However, due to the conductivity modulation of the power amplifier's feedback resistors, the digital-to-analog converter's resistors, and the reference generation circuit's resistors, the total linearity of the audio circuitry can be severely impacted. The scaling circuit, however, provides respective voltages to body terminals of respective pairs of resistors to reduce the conductivity modulation relative to audio circuitry that does not include the scaling circuit.

For example, the scaling circuit provides a first voltage at the body terminals of a first pair of resistors within the power amplifier circuit, a second voltage at the body terminals of a second pair of resistors within the digital-to-analog converter, and a third voltage at the body terminals of a third pair of resistors within the reference generation circuit. The scaling circuit provides the first, second, and third voltages such that a summation of the first voltage and the third voltage reduced by the second voltage is approximately equal to an average of a common-mode reference voltage, which is provided at the reference generation circuit and the power amplifier circuit, and a common-mode output voltage, which is provided at differential outputs of the power amplifier circuit. By reducing the conductivity modulation, the scaling circuit decreases the total harmonic distortion within the audio circuitry relative to audio circuitry that does not include the scaling circuit.

FIG. 1 illustrates an example computing device 102 with audio circuitry 122 that reduces resistor conductivity modulation during amplification. In an example environment 100, the computing device 102 communicates with a base station 104 through a wireless communication link 106 (wireless link 106). In this example, the computing device 102 is depicted as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, wearable computer, server, network-attached storage (NAS) device, smart appliance or other internet of things (IoT) device, medical device, vehicle-based communication system, radio apparatus, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, server device, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, or an uplink of other data or control information communicated from the computing device 102 to the base station 104. The wireless link 106 may be implemented using any suitable communication protocol or standard, such as second-generation (2G), third-generation (3G), fourth-generation (4G), or fifth-generation (5G) cellular; IEEE 802.11 (e.g., Wi-Fi™); IEEE 802.15 (e.g., Bluetooth™); IEEE 802.16 (e.g., WiMAX™); and so forth. In some implementations, the wireless link 106 may wirelessly provide power and the base station 104 may comprise a power source.

As shown, the computing device 102 includes an application processor 108 and a computer-readable storage medium 110 (CRM 110). The application processor 108 may include any type of processor, such as a multi-core processor, that executes processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless local area network (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks. The wireless transceiver 120 includes circuitry and logic for transmitting and receive communication signals. Components of the wireless transceiver 120 include at least one transmitter, at least one receiver, at least one antenna array, and at least one processor (e.g., a modem).

The computing device 102 also includes audio circuitry 122, which can be implemented as part of, for instance a coder/decoder (CODEC) (not shown) of the computing device 102. The audio circuitry 122 converts an electrical input signal into an audible sound. The electrical input signal can include a voice signal that is communicated over the wireless link 106 and provided by the wireless transceiver 120, music from an application that is executed by the application processor 108, or some other signal provided by components within the computing device 102. The audio circuitry 122 includes a power amplifier circuit 124 with at least one first pair of resistors 126 ($R_F$ 126), a digital-to-analog converter 128 with at least one second pair of resistors 130 ($R_D$ 130), and a reference generation circuit 132 with at least one third pair of resistors 134 ($R_R$ 134). The audio circuitry 122 also includes a scaling circuit 136. Other components of the audio circuitry 122 are further described with respect to FIG. 4.

Resistors of the pairs of resistors 126, 130, and 134 can be implemented using polysilicon resistors (e.g., poly-resistors) and are disposed on a substrate of the audio circuitry 122. Each of the poly-resistors is formed with a resistive strip and a dielectric layer, which isolates the resistive strip from the substrate. Terminals of the poly-resistor are positioned on either side of the resistive strip. In some cases, the resistive strip is formed over a semiconductor region on the substrate, such as over a doped region or "well" in the substrate (e.g., an N-well, a P-well, a deep N-well, a deep P-well, and so forth). In other cases, the resistive strip is formed over the substrate. Each poly-resistor also includes a body terminal, which is either connected to the well or the substrate, depending on the implementation.

A battery 138 of the computing device 102 enables the computing device 102 to operate in a mobile configuration. Example types of batteries 138 include a Li-Ion battery or a Lithium-Polymer (Li-Poly) battery. In some cases, the battery 138 includes multiple batteries, such as a main battery and a supplemental battery, and/or multiple battery cell combinations. Sometimes a voltage limitation of the battery 138 is insufficient for achieving a target output volume for the audio circuitry 122.

In general, the power amplifier circuit 124 and/or the digital-to-analog converter 128 can operate in a class-G fashion or a class-H fashion, which causes a conductivity of the pairs of resistors 126, 130, or 134 to vary over time in an intermittent or continuous manner. The scaling circuit 136 generates one or more voltages to reduce the conductivity modulation, and therefore improve the total harmonic distortion. The power amplifier circuit 124, the digital-to-analog converter 128, and the reference generation circuit 132 are further described with respect to FIG. 2.

Figure 2:
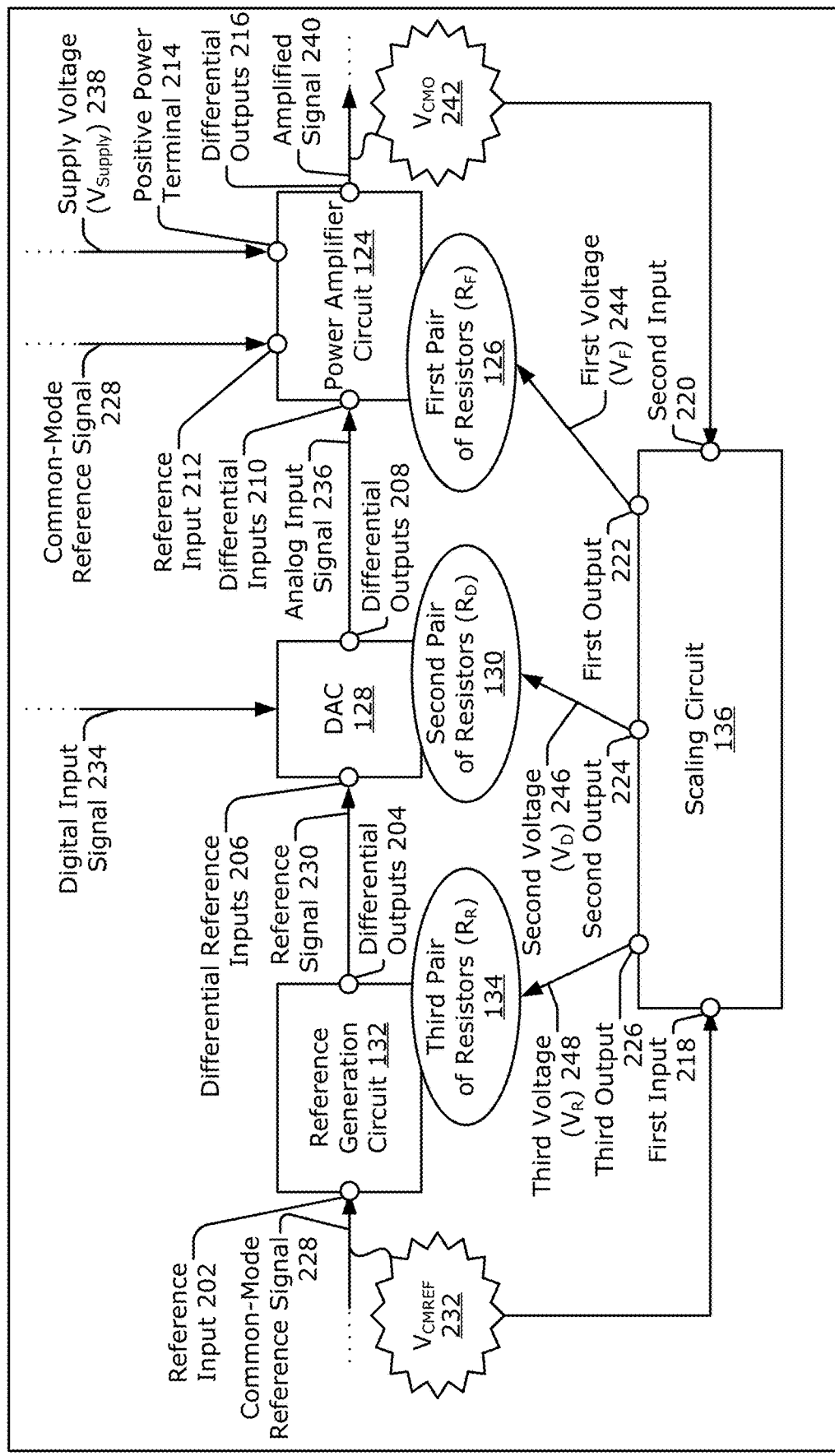
FIG. 2 illustrates example audio circuitry with a scaling circuit that reduces resistor conductivity modulation during amplification.

FIG. 2 illustrates example audio circuitry 122 with a scaling circuit 136 that reduces resistor conductivity modulation during amplification. In the depicted configuration, the reference generation circuit 132 includes a reference input 202 and differential outputs 204. The digital-to-analog converter 128 includes differential reference inputs 206 and differential outputs 208. The differential reference inputs 206 of the digital-to-analog converter 128 are respectively connected to the differential outputs 204 of the reference generation circuit 132.

Figure 4:
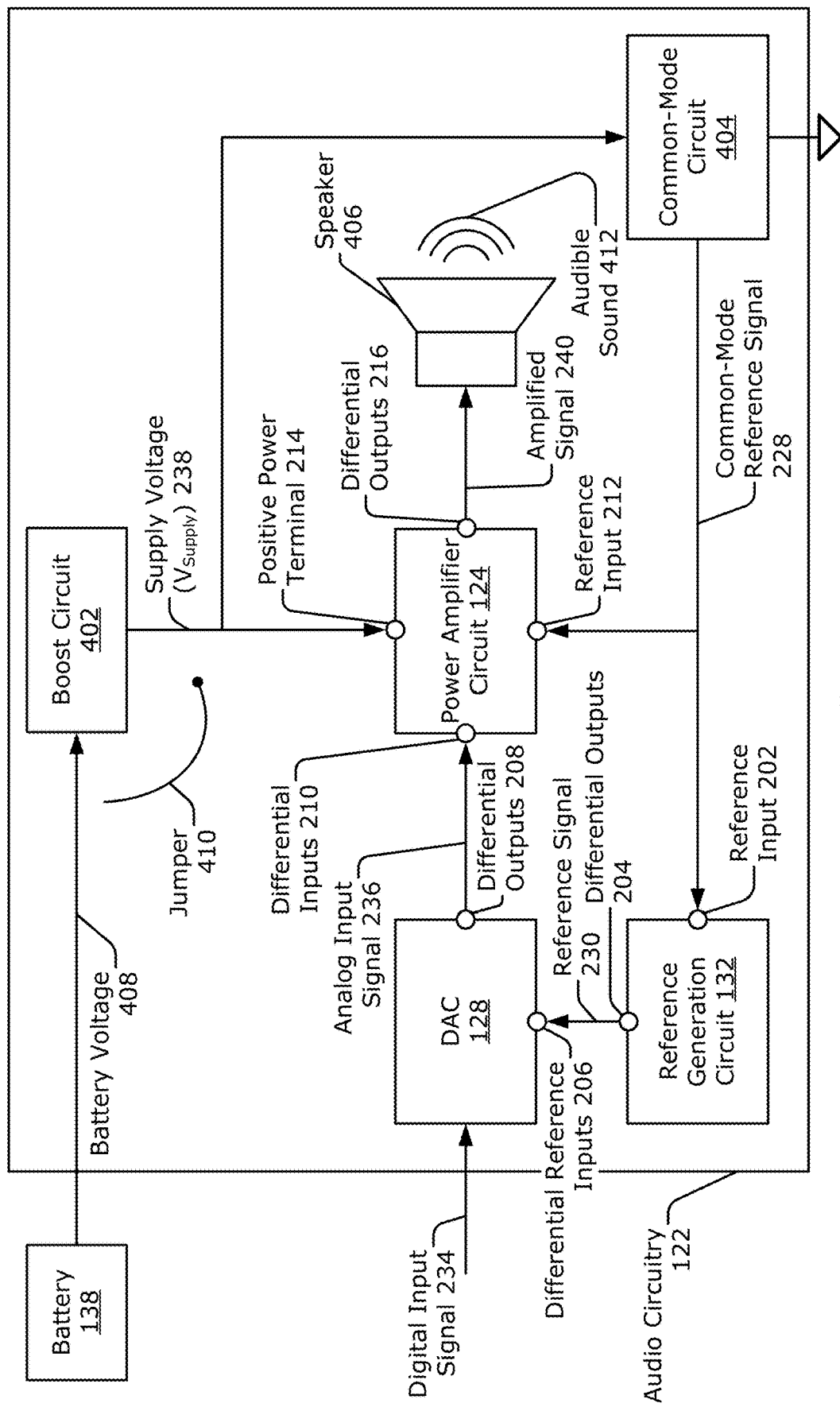
FIG. 4 illustrates example audio circuitry with a boost circuit and a common-mode circuit.

The power amplifier circuit 124 includes differential inputs 210, a reference input 212, a positive power terminal 214, and differential outputs 216. The differential inputs 210 of the power amplifier circuit 124 are respectively connected to the differential outputs 208 of the digital-to-analog converter 128. The differential outputs 216 of the power amplifier circuit 124 are connected to other components within the audio circuitry 122, such as a speaker as shown in FIG. 4. The positive power terminal 214 is connected (indirectly or directly) to the battery 138 of FIG. 1. In some implementations, the positive power terminal 214 is connected to a boost circuit, as shown in FIG. 4.

The power amplifier circuit 124 can be realized using any suitable type of differential amplifier, such as cascade, cascode, folded, shunted, or combinations thereof. The power amplifier circuit 124 can include any suitable type and number of transistors, such as a bipolar junction transistor (BJT) or a field-effect transistor (FET). The transistors can be fabricated in any suitable process.

The scaling circuit 136 includes two inputs 218 and 220 and three outputs 222, 224, and 226. A first input 218 is connected to both the reference input 202 of the reference generation circuit 132 and the reference input 212 of the power amplifier circuit 124. A second input 220 is connected to the differential outputs 216 of the power amplifier circuit 124. A first output 222 is connected to body terminals of the first pair of resistors 126. A second output 224 is connected to body terminals of the second pair of resistors 130. A third output 226 is connected to body terminals of the third pair of resistors 134.

During operation, a common-mode reference signal 228 is accepted at both the reference input 202 of the reference generation circuit 132 and the reference input 212 of the power amplifier circuit 124. The common-mode reference signal 228 includes a common-mode reference voltage 232 ($V_{CMREF}$ 232). The reference generation circuit 132 level-shifts the common-mode reference signal 228 to generate a reference signal 230. The reference signal 230 comprises a differential analog signal, which includes a common component based on the common-mode reference voltage $V_{CMREF}$ 232 and a differential component that is based on resistances of the third pair of resistors $R_R$ 134.

The digital-to-analog converter 128 accepts the reference signal 230 and a digital input signal 234. The digital input signal 234 includes audio information or data that is provided by the application processor 108, the wireless transceiver 120, or another component within the computing device 102. The digital-to-analog converter 128 selectively connects each resistor of the second pair of resistors 130 to an individual one of the differential reference inputs 206 based on the digital input signal 234. In this manner, the digital-to-analog converter 128 generates an analog input signal 236 based on the digital input signal 234 and the differential reference inputs 206. The analog input signal 236 comprises a differential analog signal having a common component and a differential component.

The power amplifier circuit 124 accepts the analog input signal 236 at the differential inputs 210, the common-mode reference signal 228 at the reference input 212, and a supply voltage 238 ($V_{Supply}$ 238) at the positive power terminal 214. The power amplifier circuit 124 amplifies the analog input signal 236 using the supply voltage 238 to generate an amplified signal 240 at the differential outputs 216. The amplified signal 240 comprises a differential analog signal that includes a common component represented by common-mode output voltage 242 ($V_{CMO}$ 242) and a differential component.

The scaling circuit 136 accepts the common-mode reference voltage $V_{CMREF}$ 232 at the first input 218 and the common-mode output voltage $V_{CMO}$ 242 at the second input 220. Alternatively, the scaling circuit 136 accepts the amplified signal 240 at the second input 220 and includes a summing circuit that sums differential output voltages of the amplified signal 240 together to remove the differential component $V_{Diff}$ and retain the common component $V_{CMO}$ 242.

The scaling circuit 136 provides a first voltage 244 ($V_F$ 244) to body terminals of the first pair of resistors 126, provides a second voltage 246 ($V_D$ 246) to body terminals of the second pair of resistors 130, and provides a third voltage 248 ($V_R$ 248) to body terminals of the third pair of resistors 134. To reduce conductivity modulation within the pairs of resistors 126, 130, and 134 that result from techniques that enable the audio circuitry 122 to produce a target output volume by varying the supply voltage 238 and/or the analog input signal 236, at least one of the voltages $V_F$ 244, $V_D$ 246, or $V_R$ 248 is based on at least one of the common-mode reference voltage $V_{CMREF}$ 232 or the common-mode output voltage $V_{CMO}$ 242. In particular, the scaling circuit 136 sets a summation of the first voltage 244 and the third voltage 248 reduced (e.g., subtracted) by the second voltage 246 approximately equal to an average of the common-mode reference voltage $V_{CMREF}$ 232 and the common-mode output voltage $V_{CMO}$ 242. This is shown in Equation 1 below.

$$\frac{V_{CMREF} + V_{CMO}}{2} = V_F + V_R - V_D \quad \text{Equation 1}$$

There are a variety of different implementations of the scaling circuit 136 that satisfy Equation 1. A first implementation of the scaling circuit 136 (shown in FIG. 5-1) sets the first voltage $V_F$ 244 equal to approximately half of the common-mode output voltage $V_{CMO}$ 242, the second voltage $V_D$ 246 equal to approximately half of the common-mode reference voltage $V_{CMREF}$ 232, and the third voltage $V_R$ 248 approximately equal to the common-mode reference voltage $V_{CMREF}$ 232. A second implementation of the scaling circuit 136 (shown in FIG. 5-2) sets the first voltage $V_F$ 244 approximately equal to a ground voltage (e.g., zero), the second voltage $V_D$ 246 also approximately equal to the ground voltage (e.g., zero), and the third voltage $V_R$ 248 approximately equal to an average of the common-mode reference voltage $V_{CMREF}$ 232 and the common-mode output voltage $V_{CMO}$ 242.

Figure 3:
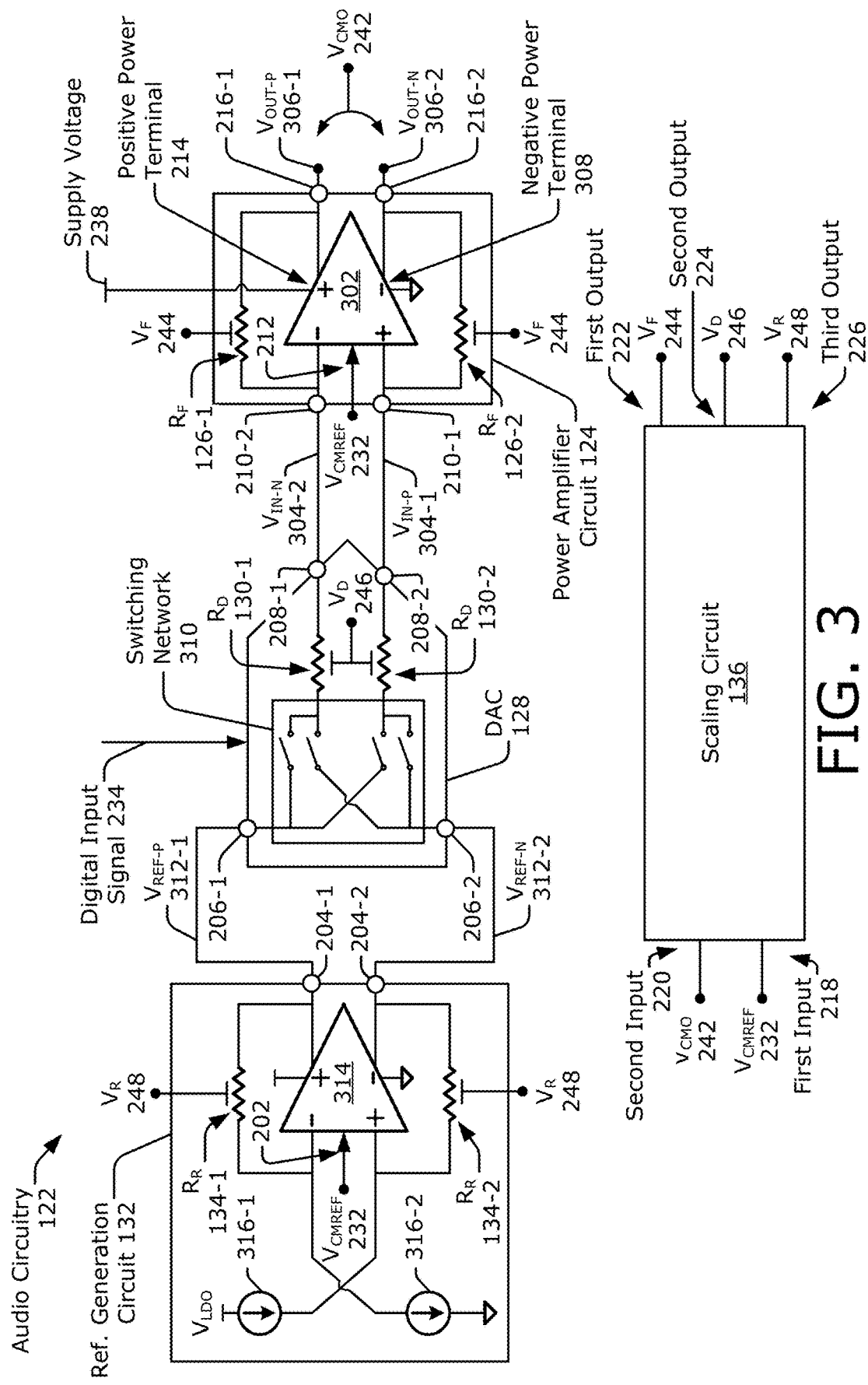
FIG. 3 illustrates an example power amplifier circuit, an example digital-to-analog converter, and an example reference generation circuit.

FIG. 3 illustrates an example power amplifier circuit 124, an example digital-to-analog converter 128, and an example reference generation circuit 132. In the depicted configuration, the power amplifier circuit 124 includes a differential amplifier 302 (e.g., an operational amplifier) and the first pair of resistors 126, shown as $R_F$ 126-1 and $R_F$ 126-2. The differential inputs 210 (shown in FIG. 2) of the power amplifier circuit 124 include a positive (e.g., non-inverting) input 210-1 and a negative (e.g., inverting) input 210-2. A positive input of the differential amplifier 302 (denoted with a plus sign) is connected to the positive input 210-1, and a negative input of the differential amplifier 302 (denoted with a minus sign) is connected to the negative input 210-2. The differential outputs 216 of the power amplifier circuit 124 (shown in FIG. 2) include a positive output 216-1 and a negative output 216-2. A positive output of the differential amplifier 302 is connected to the positive output 216-1, and a negative output of the differential amplifier 302 is connected to the negative output 216-2.

The differential amplifier 302 includes the positive power terminal 214 (denoted with a plus sign), which is connected to the supply voltage 238, such as +5.0 volts, or any suitable voltage value. The differential amplifier 302 also includes a negative power terminal 308 (denoted with a negative sign), which is connected to ground.

In some implementations, the differential amplifier 302 includes a control loop (not shown), which accepts the common-mode reference voltage $V_{CMREF}$ 232 at the reference input 212 and adjusts the common-mode output voltage $V_{CMO}$ 242 to match the common-mode reference voltage $V_{CMREF}$ 232. In other implementations, the common-mode output voltage $V_{CMO}$ 242 differs from the common-mode reference voltage $V_{CMREF}$ 232.

The first pair of resistors 126 are implemented as a pair of feedback resistors. In particular, the resistor $R_F$ 126-1 is connected between the positive output 216-1 and the negative input 210-2. The resistor $R_F$ 126-2 is connected between the negative output 216-2 and the positive input 210-1. The resistors $R_F$ 126-1 and $R_F$ 126-2 can have substantially similar resistances. Any mismatch in the resistors $R_F$ 126-1 and $R_F$ 126-2 results in CM-DM conversion, causing increased distortion and a degradation in the power supply rejection ratio. Example types of distortion include a total harmonic distortion and a second harmonic distortion. For instance, resistor mismatch results in different currents flowing at the positive and negative inputs to the differential amplifier 302, which can cause distortion.

The differential amplifier 302 accepts a positive input voltage $V_{IN-P}$ 304-1 of the analog input signal 236 (of FIG. 2) at the positive input and a negative input voltage $V_{IN-N}$ 304-2 of the analog input signal 236 at the negative input. The differential amplifier 302 amplifies the input voltages 304-1 and 304-2 to generate a positive output voltage $V_{OUT-P}$ 306-1 at the positive output 216-1 and a negative output voltage $V_{OUT-N}$ 306-2 at the negative output 216-2.

The output voltages $V_{OUT-P}$ 306-1 and $V_{OUT-N}$ 306-2 each include a common component and a portion of a differential component. The differential component is split equally between the output voltages $V_{OUT-P}$ 306-1 and $V_{OUT-N}$ 306-2, as shown in Equation 2 and Equation 3 below.

$$V_{OUT-P} = V_{CMO} + \frac{V_{Diff}}{2} \quad \text{Equation 2}$$

$$V_{OUT-N} = V_{CMO} - \frac{V_{Diff}}{2} \quad \text{Equation 3}$$

Here "$V_{CMO}$" is the common mode component and "$V_{DIFF}$" is the differential component.

The digital-to-analog converter 128 includes a switching network 310 and the second pair of resistors 130, shown as resistor $R_D$ 130-1 and resistor $R_D$ 130-2. The differential reference inputs 206 (of FIG. 2) include a positive reference input 206-1 and a negative reference input 206-2. The differential outputs 208 (of FIG. 2) include a positive output 208-1 and a negative output 208-2. The resistors $R_D$ 130-1 and $R_D$ 130-2 are respectively connected to the differential outputs 208-1 and 208-2. The resistors $R_D$ 130-1 and $R_D$ 130-2 are also connected to the switching network 310.

The digital-to-analog converter 128 accepts a positive reference voltage $V_{REF-P}$ 312-1 at the positive reference input 206-1 and a negative reference voltage $V_{REF-N}$ 312-2 at the negative reference input 206-2. The switching network 310 is connected to the differential reference inputs 206-1 and 206-2 and the second pair of resistors 130. The switching network 310 selectively connects the resistors $R_D$ 130-1 and $R_D$ 130-2 to the differential reference inputs 206-1 and 206-2 based on the digital input signal 234.

The reference generation circuit 132 includes a differential amplifier 314 (e.g., an operational amplifier) and the third pair of resistors 134, shown as resistor $R_R$ 134-1 and resistor $R_R$ 134-2. The differential outputs 204 (shown in FIG. 2) of the power amplifier circuit 124 include a positive output 204-1 and a negative output 204-2. A positive output of the differential amplifier 34 is connected to the positive output 204-1, and a negative output of the differential amplifier 314 is connected to the negative output 204-2.

The reference generation circuit 132 also includes current sources 316-1 and 316-2. The current source 316-1 is connected between a low dropout regulator (not shown) and the positive input of the differential amplifier 314. The low dropout regulator provides a supply voltage $V_{LDO}$. The current source 316-2 is connected between the negative input of the differential amplifier 314 and the ground. A same direct-current $I_{DC}$ flows through the first current source 316-1 and the second current source 316-2.

The differential amplifier 314 includes a positive power terminal (denoted with a plus sign), which is connected to a supply voltage, such as +5.0 volts, or any suitable voltage value. In some implementations, the supply voltage is constant and does not significantly vary over time. The differential amplifier 314 also includes a negative power terminal (denoted with a negative sign), which is connected to ground. The differential amplifier 314 can also include a control loop (not shown), which accepts the common-mode reference voltage $V_{CMREF}$ 232 at the reference input 202 and adjusts the common component at the differential outputs 204 to match the common-mode reference voltage $V_{CMREF}$ 232.

The third pair of resistors 134 are implemented as a pair of feedback resistors. In particular, the resistor $R_R$ 134-1 is connected between the positive output 204-1 and the negative input of the differential amplifier 314. The resistor $R_R$ 134-2 is connected between the negative output 204-2 and the positive input of the differential amplifier 314.

The reference generation circuit 132 level-shifts the common-mode reference voltage $V_{CMREF}$ 232 to generate the positive reference voltage $V_{REF-P}$ 312-1 and the negative reference voltage $V_{REF-N}$ 312-2. The positive reference voltage 312-1 and the negative reference voltage 312-2 each include a common component and a differential component, as shown in Equations 4 and 5 below.

$$V_{REF-P} = V_{CMREF} + I_{DC}R_R \quad \text{Equation 4}$$

$$V_{REF-N} = V_{CMREF} - I_{DC}R_R \quad \text{Equation 5}$$

Here "$R_R$" represents individual resistances of the resistors $R_R$ 134-1 and $R_R$ 134-2, which are assumed to be substantially equal to each other.

In FIG. 3, a gain of the audio circuitry 122 is dependent upon respective resistances of the pairs of resistors 126, 130, and 134. The relationship between the gain and the resistances of the pairs of resistors 126, 130, and 134 is shown in Equation 6 below.

$$\text{Gain} = 2IR_R \frac{R_F}{R_D} \quad \text{Equation 6}$$

Here "$R_F$" represents individual resistances of the resistors $R_F$ 126-1 and $R_F$ 126-2, which are assumed to be substantially equal to each other. Similarly, "$R_D$" represents individual resistances of the resistors $R_D$ 130-1 and $R_D$ 130-2, which are also assumed to be substantially equal to each other. However, due to a design of the audio circuitry 122 that varies the supply voltage 238 or the common-mode reference voltage $V_{CMREF}$ 232 as a function of the amplified signal 240 (of FIG. 2), these resistances can change due to conductivity modulation, as shown in Equations 7, 8, and 9 below.

$$R_R = R_{R0}(1 + \beta(V_{CMREF} - V_R)) \quad \text{Equation 7}$$

$$R_D = R_{D0}\left(1 + \beta\left(\frac{V_{CMREF} + V_{gCM}}{2} - V_D\right)\right) \quad \text{Equation 8}$$

$$R_F = R_{F0}\left(1 + \beta\left(\frac{V_{CMO} + V_{gCM}}{2} - V_F\right)\right) \quad \text{Equation 9}$$

Here "$\beta$" represents a fixed value determined based on a manufacturing process of the resistor, and "$V_{gCM}$" represents a common-mode voltage at the differential inputs 210-1 and 210-2. The variables "$R_{R0}$", "$R_{D0}$", and "$R_{F0}$" represent respective nominal resistances of the first pair of resistors 126, the second pair of resistors 130, and the third pair of resistors 134. As seen in the above equations, a portion of the resistance that varies due to conductivity modulation is dependent upon a voltage that is applied at the body terminal of the resistor (e.g., the first voltage $V_F$ 244, the second voltage $V_D$ 246, or the third voltage $V_R$ 248) and either the common-mode reference voltage $V_{CMREF}$ 232 or the common-mode output voltage $V_{CMO}$ 242.

Substituting Equations 7, 8, and 9 into Equation 6 and setting the conductivity modulation components of the resistances to zero yields Equation 1, which describes a relationship between the voltages applied at the body terminals (e.g., the voltages $V_F$ 244, $V_D$ 246, and $V_R$ 248), the common-mode reference voltage $V_{CMREF}$ 232, and the common-mode output voltage $V_{CMO}$ 242 for canceling the effects of the conductivity modulation. In other words, satisfying Equation 1 enables the individual resistances of the first pair of resistors 126 to be substantially equal to $R_{F0}$, the individual resistances of the second pair of resistors $R_D$ 130 to be substantially equal to $R_{D0}$, and the individual resistances of the pair of resistors $R_R$ 134 to be substantially equal to $R_{R0}$. The scaling circuit 136 generates the voltages $V_F$ 244, $V_D$ 246, and $V_R$ 248 according to Equation 1 to reduce the conductivity modulation and thereby reduce the total harmonic distortion.

FIG. 4 illustrates example audio circuitry 122 with a boost circuit 402 and a common-mode circuit 404. The boost circuit 402 is connected between the battery 138 and the positive power terminal 214 of the power amplifier circuit 124. The common-mode circuit 404 is coupled to the positive power terminal 214, the reference input 202 of the reference generation circuit 132, the reference input 212 of the power amplifier circuit 124, and a ground. The differential outputs 216 of the power amplifier circuit 124 are connected to a speaker 406.

In a first example, the battery 138 provides a battery voltage 408 that is insufficient for achieving a target output volume. To increase the battery voltage 408, the boost circuit 402 boosts the battery voltage 408 and provides a supply voltage 238 that is greater than the battery voltage 408. To improve efficiency, the boost circuit 402 further varies the supply voltage 238 as a function of the amplified signal 240, such as via envelope tracking in a class-H fashion.

In a second example, the battery voltage 408 is sufficient for achieving the target output volume. In this case, a jumper 410 bypasses the boost circuit 402 and provides the battery voltage 408 as the supply voltage 238. Alternatively, the boost circuit 402 and the jumper 410 are omitted from the audio circuitry 122, and the battery 138 is directly connected to the positive power terminal 214 of the power amplifier circuit 124.

The common-mode circuit 404 is connected to the positive power terminal 214 of the power amplifier circuit 124 and accepts the supply voltage 238. The common-mode circuit 404 generates the common-mode reference signal ($V_{CMREF}$) 228 based on the supply voltage 238. In one example, the common-mode circuit 404 comprises a voltage divider that provides half of the supply voltage 238 as the common-mode reference signal 228. In another example, the common-mode circuit 404 includes a summing circuit that sums the differential output voltages 306-1 and 306-2 together (e.g., $V_{OUT-P}+V_{OUT-N}$ of FIG. 3) to remove the differential component $V_{Diff}$ in Equations 2 and 3 and retain the common component, the common-mode output voltage $V_{CMO}$ 242.

If the supply voltage 238 varies as a function of the amplified signal 240, the common-mode reference signal 228 also varies as a function of the amplified signal 240. To further reduce total harmonic distortion, a version of the amplified signal 240 is fed back to the power amplifier circuit 124 via the reference generation circuit 132 and the digital-to-analog converter 128 such that the analog input signal 236 varies as a function of the amplified signal 240. The audio circuitry 122 therefore mitigates the distortion caused by CM-DM conversion by coupling the common-mode output voltage $V_{CMO}$ 242 to the analog input signal 236. Thus, since approximately the same common-mode signal is present at the output of the power amplifier circuit 124 and at the input of the power amplifier circuit 124 at approximately the same time, current due to the common mode component drops substantially to zero at the differential inputs of the power amplifier. Hence, CM-DM is reduced, regardless of a mismatch of resistors within the power amplifier circuit 124.

Operations of the reference generation circuit 132, the digital-to-analog converter 128, and the power amplifier circuit 124 are described above with respect to FIG. 3. The speaker 406 accepts the amplified signal 240 and generates an audible sound 412, which can be heard by a user of the computing device 102.

The techniques described for reducing resistor conductivity modulation during amplification can be applied to any type of audio circuitry 122 that varies the supply voltage 238 as a function of the amplified signal 240 and/or varies the analog input signal 236 as a function of the amplified signal 240. These variations can occur continuously, such as in a class-H fashion, or intermittently, such as in a class-G fashion. In the context of the described implementation, the techniques can be applied if the power amplifier circuit 124 and/or the digital-to-analog converter 128 operates in a class-G fashion or a class-H fashion. These techniques can also be applied to other types of circuitry, such as amplification circuitry within the wireless transceiver 120.

In an alternative implementation, the audio circuitry 122 includes a feedback circuit (not shown) that is coupled between the common-mode circuit 404 and the reference generation circuit 132. The feedback circuit generates a feedback signal based on the common-mode reference signal 228 and provides the feedback signal to the reference generation circuit 132 instead of the common-mode reference signal 228. In particular, the feedback circuit shifts a voltage of the common-mode reference signal 228 up or down. In some implementations, the feedback circuit includes a filter (e.g., a low-pass filter, a high-pass filter, or a band-pass filter) to filter the common-mode reference signal 228. Additionally or alternatively, the feedback circuit includes an adder or a subtractor to combine a signal with the common-mode reference signal 228. The feedback circuit can also include a limiter to limit the common-mode reference signal 228 to a range of voltages, a soft compressor to inhibit the common-mode reference signal 228 beyond a certain range of voltages, a buffer, an amplifier, or combinations thereof.

In another implementation, the digital-analog converter 128 and the reference generation circuit 132 are replaced by an input circuit (not shown) that accepts a differential analog signal instead of the digital input signal 234. The input circuit can include a summing circuit that sums the common-mode reference signal 228 or the feedback signal with the differential components of the differential input signal. Example implementations of the scaling circuit 136 are further described with respect to FIGS. 5-1 and 5-2.

Figures 1, 5:
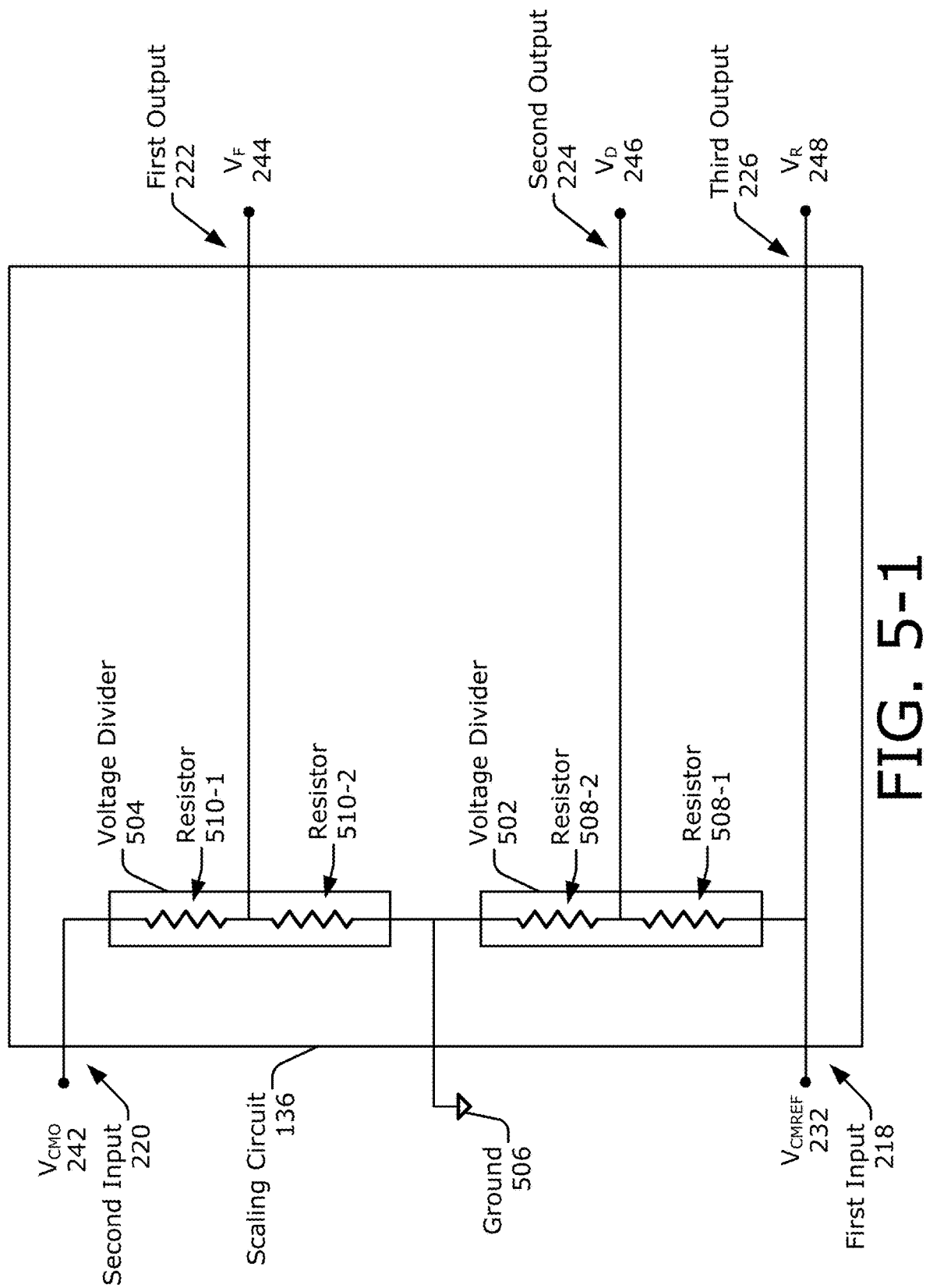
Figures 2, 5:
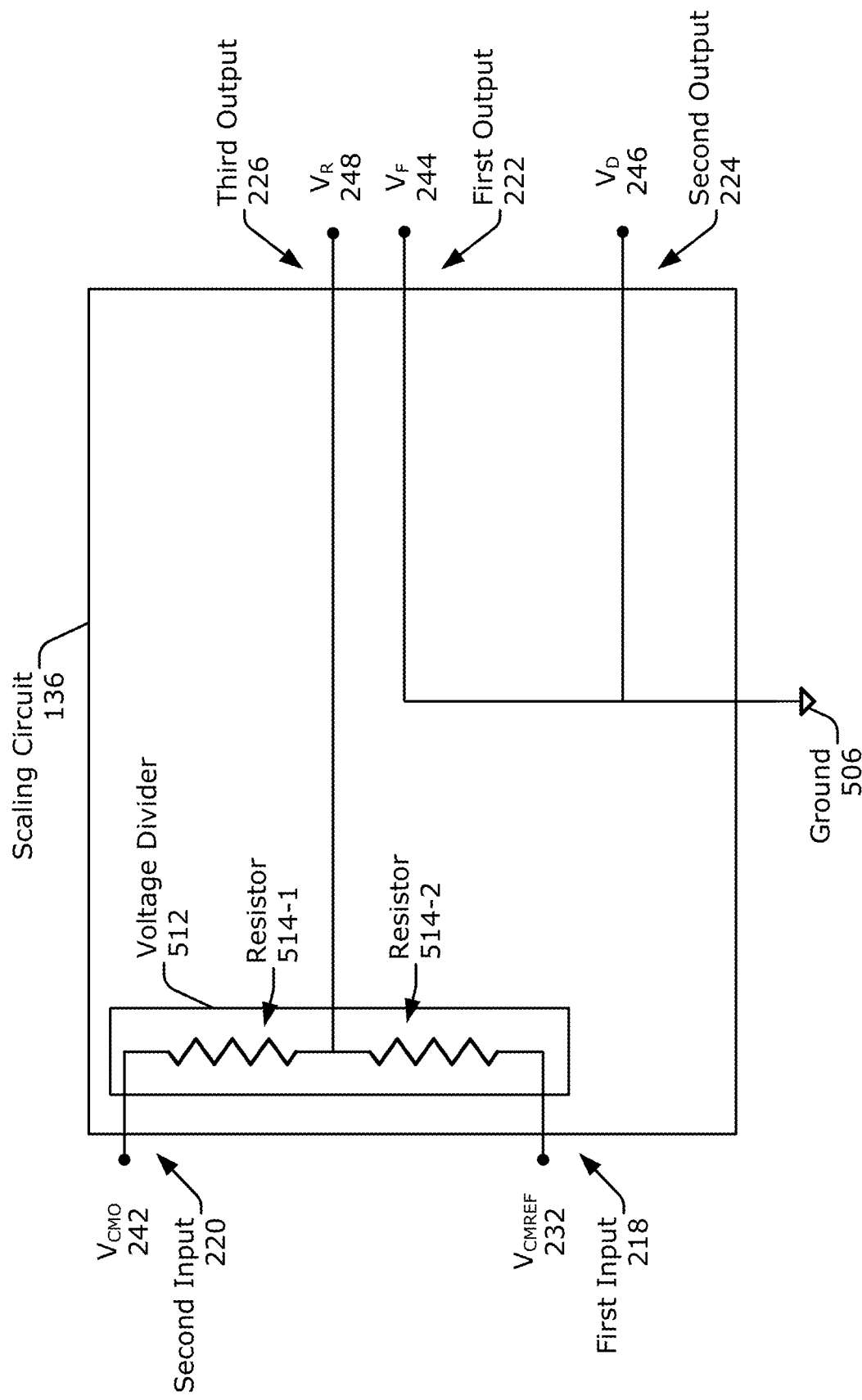

FIG. 5-1 illustrates an example scaling circuit 136 that reduces resistor conductivity modulation during amplification. In the depicted configuration, the scaling circuit 136 satisfies Equation 1 by providing half of the common-mode output voltage $V_{CMO}$ 242 as the first voltage $V_F$ 244, half of the common-mode reference voltage $V_{CMREF}$ 232 as the second voltage $V_D$ 246, and the common-mode reference voltage $V_{CMREF}$ 232 as the third voltage $V_R$ 248.

The scaling circuit 136 includes a voltage divider 502 and a voltage divider 504. The voltage divider 502 includes a resistor 508-1, which is connected between the first input 218 and the second output 224, and a resistor 508-2, which is connected between the second output 224 and a ground 506. Resistances of the resistors 508-1 and 508-2 are substantially equal to each other to cause the second voltage $V_D$ 246 to be approximately equal to approximately half of the common-mode reference voltage $V_{CMREF}$ 232.

The voltage divider 504 includes a resistor 510-1, which is connected between the second input 220 and the first output 222, and a resistor 510-2, which is connected between the first output 222 and the ground 506. Resistances of the resistors 510-1 and 510-2 are substantially equal to each other to cause the first voltage $V_F$ 244 to be approximately equal to approximately half of the common-mode output voltage $V_{CMO}$ 242.

The scaling circuit 136 also includes an electrical connection between the first input 218 and the third output 226. This causes the third voltage $V_R$ 248 to be approximately equal to the common-mode reference voltage $V_{CMREF}$ 232.

In this example, the first pair of resistors 126 is formed in a first well, the second pair of resistors 130 is formed in a second well, and the third pair of resistors is formed in a third well. In an example implementation, the first well, the second well, and the third well comprise deep N-wells. The body terminals of the first pair of resistors 126 are connected to the first well. Similarly, the body terminals of the second pair of resistors 130 are connected to the second well. The body terminals of the third pair of resistors 134 are connected to the third well. Having multiple deep N-wells, however, can increase a size of the audio circuitry 122. Alternatively, one of the pairs of resistors 126, 130, or 134 can be implemented with a deep N-well, as further described with respect to FIG. 5-2.

FIG. 5-2 illustrates another example scaling circuit 136 that reduces resistor conductivity modulation during amplification. In the depicted configuration, the scaling circuit 136 satisfies Equation 1 by grounding both the first voltage $V_F$ 244 and the second voltage $V_D$ 246, which effectively sets the voltages $V_F$ 244 and $V_D$ 246 equal to zero. Additionally, the scaling circuit 136 provides an average of the common-mode reference voltage $V_{CMREF}$ 232 and the common-mode output voltage $V_{CMO}$ 242 as the third voltage $V_R$ 248. By providing the ground for two of the voltages (e.g., the first voltage $V_F$ 244 and the second voltage $V_D$ 246), the scaling circuit 136 of FIG. 5-2 satisfies Equation 1 in such a way that the audio circuitry 122 can use a single well for providing the remaining voltage (e.g., the third voltage $V_R$ 248). Use of a single well enables the audio circuitry 122 to conserve space and have a smaller footprint relative to other designs that use multiple wells.

The scaling circuit 136 includes a voltage divider 512, which includes a resistor 514-1 and a resistor 514-2. The resistor 514-1 is connected between the second input 220 and the third output 226. The resistor 514-2 is connected between the third output 226 and the first input 218. Resistances of the resistors 514-1 and 514-2 are substantially equal to each other to cause the third voltage $V_R$ 248 to be approximately equal to an average of the common-mode output voltage $V_{CMO}$ 242 and the common-mode reference voltage $V_{CMREF}$ 232.

The scaling circuit 136 also includes electrical connections that connect both the first output 222 and the second output 224 to the ground 506. By grounding the outputs 222 and 224, the first voltage $V_F$ 244 and the second voltage $V_D$ 246 are approximately equal to zero.

In this example, the first pair of resistors 126 and the second pair of resistors 130 have body terminals that are connected to the substrate. The third pair of resistors 134, however, is formed in a well, such as a deep N-well. As such, the body terminals of the third pair of resistors 134 are connected to the well.

FIG. 6 is a flow diagram illustrating an example process 600 for reducing resistor conductivity modulation during amplification. The process 600 is described in the form of a set of blocks 602-608 that specify operations that can be performed. However, operations are not necessarily limited to the order shown in FIG. 6 or described herein, for the operations may be implemented in alternative orders or in fully or partially overlapping manners. Operations represented by the illustrated blocks of the process 600 may be performed by audio circuitry 122 (e.g., of FIG. 1, 2, or 4). More specifically, the operations of the process 600 may be performed, in part, by a scaling circuit 136 as shown in FIGS. 1, 2, 3, 5-1, and 5-2.

At block 602, an analog input signal is amplified to generate an amplified signal using a power amplifier circuit. The amplified signal comprises a common-mode output voltage. The power amplifier circuit comprises a first pair of resistors and a first differential amplifier connected to a common-mode reference voltage. For example, the power amplifier circuit 124 amplifies the analog input signal 236 to generate the amplified signal 240, as shown in FIG. 2. The amplified signal comprises the common-mode output voltage $V_{CMO}$ 242, as shown in Equations 2 and 3. The power amplifier circuit 124 comprises the first pair of resistors 126 and the differential amplifier 302 that is connected to the common-mode reference voltage $V_{CMREF}$ 232, as shown in FIG. 3.

At block 604, the analog input signal is generated based on a digital input signal and differential reference voltages using a digital-to-analog converter. The digital-to-analog converter comprises a second pair of resistors. For example, the digital-to-analog converter 128 generates the analog input signal 236 based on the digital input signal 234 and the differential reference voltages 312-1 and 312-2, as shown in FIG. 3. The digital input signal 234 is provided by the application processor 108, the wireless transceiver 120, or another component of the computing device 102. The digital-to-analog converter 128 comprises the second pair of resistors 130, as shown in FIG. 2.

At block 606, the differential reference voltages are generated using a reference generation circuit. The reference generation circuit comprises a third pair of resistors and a second differential amplifier that is connected to the common-mode reference voltage. For example, the reference generation circuit 132 generates the differential reference voltages 312-1 and 312-2, as shown in FIG. 3. The reference generation circuit 132 comprises the pair of resistors 142 and the differential amplifier 314, which is connected to the common-mode reference voltage $V_{CMREF}$ 232.

At block 608, a first voltage is provided at body terminals of the first pair of resistors, a second voltage is provided at body terminals of the second pair of resistors, and a third voltage is provided at body terminals of the third pair of resistors such that a summation of the first voltage and the third voltage reduced by the second voltage is approximately equal to an average of the common-mode reference voltage and the common-ode output voltage. For example, the scaling circuit 136 provides the first voltage $V_F$ 244 to the body terminals of the first pair of resistors 126, provides the second voltage $V_D$ 246 to the body terminals of the second pair of resistors 130, and provides the third voltage $V_R$ 248 to the body terminals of the third pair of resistors 134. The scaling circuit 136 provides the voltages $V_F$ 244, $V_D$ 246, and $V_R$ 248 to satisfy Equation 1, which equates an average of the common-mode reference voltage $V_{CMREF}$ 232 and the common-mode output voltage $V_{CMO}$ 242 to a summation of the first voltage $V_F$ 244 and the third voltage $V_R$ 248 reduced by the second voltage $V_D$ 246.

Use of the words "approximately equal to" or "substantially similar" can include a tolerance, such as approximately ±10%. Generally, this tolerance accounts for minor losses within the audio circuitry 122 or variations due to process variations during manufacturing, temperature changes, and so forth.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
    a power amplifier circuit comprising:
        a first differential amplifier comprising a reference input and differential outputs; and
        a first pair of resistors, respective resistors of the first pair of resistors connected between respective differential inputs of the first differential amplifier and respective ones of the differential outputs of the first differential amplifier;
    a digital-to-analog converter comprising:
        differential reference inputs; and
        a second pair of resistors, respective resistors of the second pair of resistors connected to the respective differential inputs of the first differential amplifier and selectively connected to the differential reference inputs;
    a reference generation circuit comprising:
        a second differential amplifier comprising differential outputs and a reference input, the differential outputs respectively connected to the differential reference inputs of the digital-to-analog converter; and
        a third pair of resistors, respective resistors of the third pair of resistors connected between respective differential inputs of the second differential amplifier and respective ones of the differential outputs of the second differential amplifier; and
    a scaling circuit comprising:
        a first input connected to both the reference input of the first differential amplifier and the reference input of the second differential amplifier, the first input configured to accept a common-mode reference voltage;
        a second input connected to the differential outputs of the first differential amplifier and configured to accept a common-mode output voltage;
        a first output connected to body terminals of the first pair of resistors;
        a second output connected to body terminals of the second pair of resistors; and
        a third output connected to body terminals of the third pair of resistors,
        the scaling circuit configured to provide a first voltage at the first output, a second voltage at the second output, and a third voltage at the third output such that a summation of the first voltage and the third voltage reduced by the second voltage is approximately equal to an average of the common-mode reference voltage and the common-mode output voltage.

2. The apparatus of claim 1, wherein:
    the digital-to-analog converter is configured to selectively connect the respective resistors of the second pair of resistors to individual ones of the differential reference inputs of the digital-to-analog converter based on a digital input signal to generate an analog input signal;
    the power amplifier circuit is configured to amplify the analog input signal to generate an amplified signal using a supply voltage; and
    at least one of the following signals varies based on the amplified signal:
        the analog input signal; or
        the supply voltage.

3. The apparatus of claim 2, further comprising:
    a wireless transceiver connected to the digital-to-analog converter and configured to provide the digital input signal to the digital-to-analog converter, the digital input signal comprising a voice signal; and
    a speaker connected to the power amplifier circuit and configured to convert the amplified signal into an audible sound.

4. The apparatus of claim 2, further comprising:
    a boost circuit connected to a positive power terminal of the first differential amplifier, the boost circuit configured to generate the supply voltage such that the supply voltage varies based on the amplified signal.

5. The apparatus of claim 4, further comprising:
    a common-mode circuit connected to the positive power terminal of the first differential amplifier, the reference input of the first differential amplifier, the reference input of the second differential amplifier, and a ground; the common-mode circuit configured to generate the common-mode reference voltage such that the common-mode reference voltage varies based on the supply voltage to cause the analog input signal to vary based on the amplified signal.

6. The apparatus of claim 1, wherein the scaling circuit comprises:
    a first voltage divider comprising:
        a first resistor connected between the first input and the second output; and
        a second resistor connected between the second output and a ground, the first resistor and the second resistor having substantially similar resistances;
    a second voltage divider comprising:
        another first resistor connected between the second input and the first output; and
        another second resistor connected between the first output and the ground, the other first resistor and the other second resistor having substantially similar resistances; and
    an electrical connection between the first input and the third output.

7. The apparatus of claim 6, wherein:
the first voltage is approximately equal to half of the common-mode output voltage;
the second voltage is approximately equal to half of the common-mode reference voltage; and
the third voltage is approximately equal to the common-mode reference voltage.

8. The apparatus of claim 6, wherein:
the first pair of resistors is formed in a first well disposed within a substrate;
the body terminals of the first pair of resistors are connected to the first well;
the second pair of resistors is formed in a second well disposed within the substrate;
the body terminals of the second pair of resistors are connected to the second well;
the third pair of resistors is formed in a third well disposed within the substrate; and
the body terminals of the third pair of resistors are connected to the third well.

9. The apparatus of claim 8, wherein the first well, the second well, and the third well comprise deep N-wells.

10. The apparatus of claim 1, wherein the scaling circuit comprises:
a first electrical connection between the first output and a ground;
a second electrical connection between the second output and the ground; and
a voltage divider comprising:
a first resistor connected between the second input and the third output; and
a second resistor connected between the third output and the first input, the first resistor and the second resistor having substantially similar resistances.

11. The apparatus of claim 10, wherein:
the first voltage is approximately equal to zero;
the second voltage is approximately equal to zero; and
the third voltage is approximately equal to an average of the common-mode reference voltage and the common-mode output voltage.

12. The apparatus of claim 10, wherein:
the body terminals of the first pair of resistors are connected to a substrate;
the body terminals of the second pair of resistors are connected to the substrate;
the third pair of resistors is formed in a well disposed within the substrate; and
the body terminals of the third pair of resistors are connected to the well.

13. The apparatus of claim 12, wherein the well comprises a deep N-well.

14. The apparatus of claim 1, wherein the first pair of resistors, the second pair of resistors, and the third pair of resistors comprise polysilicon resistors.

15. An apparatus comprising:
a power amplifier circuit comprising:
a first differential amplifier comprising a reference input and differential outputs; and
a first pair of resistors, respective resistors of the first pair of resistors connected between respective differential inputs of the first differential amplifier and respective ones of the differential outputs of the first differential amplifier;
a digital-to-analog converter comprising:
differential reference inputs; and
a second pair of resistors, respective resistors of the second pair of resistors connected to the respective differential inputs of the first differential amplifier and selectively connected to the differential reference inputs;
a reference generation circuit comprising:
a second differential amplifier comprising differential outputs and a reference input; the differential outputs respectively connected to the differential reference inputs of the digital-to-analog converter; and
a third pair of resistors, respective resistors of the third pair of resistors connected between respective differential inputs of the second differential amplifier and respective ones of the differential outputs of the second differential amplifier; and
scaling means for providing a first voltage at body terminals of the first pair of resistors, a second voltage at body terminals of the second pair of resistors, and a third voltage at body terminals of the third pair of resistors such that a summation of the first voltage and the third voltage reduced by the second voltage is approximately equal to an average of a common-mode reference voltage and a common-mode output voltage, the common-mode reference voltage present at both the reference input of the first amplifier and the reference input of the second amplifier, the common-mode output voltage present at the differential outputs of the first amplifier, the scaling means connected to the reference input of the first amplifier, the reference input of the second amplifier, the differential outputs of the first amplifier, the body terminals of the first pair of resistors, the body terminals of the second pair of resistors, and the body terminals of the third pair of resistors.

16. The apparatus of claim 15, wherein the scaling means comprises:
first voltage-dividing means for providing approximately half of the common-mode output voltage as the first voltage;
second voltage-dividing means for providing approximately half of the common-mode reference voltage as the second voltage; and
connecting means for providing the common-mode reference voltage as the third voltage.

17. The apparatus of claim 16, wherein:
the first pair of resistors is formed in a first well disposed within a substrate;
the body terminals of the first pair of resistors are connected to the first well;
the second pair of resistors is formed in a second well disposed within the substrate;
the body terminals of the second pair of resistors are connected to the second well;
the third pair of resistors is formed in a third well disposed within a substrate; and
the body terminals of the third pair of resistors are connected to the third well.

18. The apparatus of claim 17, wherein the first well, the second well, and the third well comprise deep N-wells.

19. The apparatus of claim 15, wherein the scaling means comprises:
first grounding means for connecting the body terminals of the first pair of resistors to a ground;
second grounding means for connecting the body terminals of the second pair of resistors to the ground; and
voltage-dividing means for providing an average of the common-mode reference voltage and the common-mode output voltage as the third voltage.

20. The apparatus of claim 19, wherein:
the body terminals of the first pair of resistors are connected to a substrate;
the body terminals of the second pair of resistors are connected to the substrate;
the third pair of resistors is formed in a well disposed within the substrate; and
the body terminals of the third pair of resistors are connected to the well.

21. A method for reducing resistor conductivity modulation during amplification, the method comprising:
amplifying, using a power amplifier circuit, an analog input signal to generate an amplified signal, the amplified signal comprising a common-mode output voltage, the power amplifier circuit comprising a first pair of resistors and a first differential amplifier connected to a common-mode reference voltage;
generating, using a digital-to-analog converter, the analog input signal based on a digital input signal and differential reference voltages, the digital-to-analog converter comprising a second pair of resistors;
generating, using a reference generation circuit, the differential reference voltages, the reference generation circuit comprising a third pair of resistors and a second differential amplifier connected to the common-mode reference voltage; and
providing a first voltage at body terminals of the first pair of resistors, a second voltage at body terminals of the second pair of resistors, and a third voltage at body terminals of the third pair of resistors such that a summation of the first voltage and the third voltage reduced by the second voltage is approximately equal to an average of the common-mode reference voltage and the common-mode output voltage.

22. The method of claim 21, further comprising:
operating at least one of the following in a class-G fashion or a class-H fashion:
the power amplifier circuit; or
the digital-to-analog converter.

23. The method of claim 22, wherein:
the operating of the power amplifier circuit in the class-G fashion or the class-H fashion comprises providing, to a positive power terminal of the first differential amplifier, a supply voltage that varies based on the amplified signal; and
the operating of the digital-to-analog converter in the class-G fashion or the class-H fashion comprises generating the common-mode reference voltage such that the common-mode reference voltage varies based on the amplified signal.

24. The method of claim 21, wherein the providing of the first voltage, the second voltage, and the third voltage comprises:
scaling the common-mode output voltage such that the first voltage is approximately equal to half of the common-mode output voltage;
scaling the common-mode reference voltage such that the second voltage is approximately equal to half of the common-mode reference voltage; and
providing the common-mode reference voltage such that the third voltage is approximately equal to the common-mode reference voltage.

25. The method of claim 21, wherein the providing of the first voltage, the second voltage, and the third voltage comprises:

grounding the body terminals of the first pair of resistors such that the first voltage is approximately equal to zero;
grounding the body terminals of the second pair of resistors such that the second voltage is approximately equal to zero; and
averaging the common-mode reference voltage and the common-mode output voltage to produce an average voltage and providing the average voltage such that the third voltage is approximately equal to the average voltage.

26. An apparatus comprising:
a power amplifier circuit comprising:
a first differential amplifier comprising a reference input configured to accept a common-mode reference voltage, the first differential amplifier configured to amplify an analog input signal to generate an amplified signal, the amplified signal comprising a common-mode output voltage; and
a first pair of resistors, respective resistors of the first pair of resistors connected between respective differential inputs of the first differential amplifier and respective differential outputs of the first differential amplifier;
a boost circuit connected to a positive power terminal of the first differential amplifier and configured to generate a supply voltage that varies based on the amplified signal;
a common-mode reference circuit connected to the positive power terminal of the first differential amplifier and the reference input of the first differential amplifier, the common-mode reference circuit configured to generate the common-mode reference voltage based on the supply voltage;
a digital-to-analog converter comprising differential reference inputs and a second pair of resistors, respective resistors of the second pair of resistors connected to the respective differential inputs of the first differential amplifier, the digital-to-analog converter configured to generate the analog input signal by selectively connecting the respective resistors of the second pair of resistors to the differential reference inputs based on an input digital signal;
a reference generation circuit comprising:
a second differential amplifier comprising a reference input configured to accept the common-mode reference voltage, the second differential amplifier configured to generate the differential reference voltages; and
a third pair of resistors, respective resistors of the third pair of resistors connected between respective differential inputs of the second differential amplifier and respective differential outputs of the second differential amplifier; and
a scaling circuit connected to the common-mode reference voltage, the common-mode output voltage, body terminals of the first pair of resistors, body terminals of the second pair of resistors, and body terminals of the third pair of resistors, the scaling circuit configured to:
provide a first voltage to the body terminals of the first pair of resistors;
provide a second voltage to the body terminals of the second pair of resistors; and
provide a third voltage to the body terminals of the third pair of resistors, at least one voltage of the first voltage, the second voltage, and the third voltage based on at least one of the common-mode output voltage or the common-mode reference voltage.

27. The apparatus of claim 26, wherein:
the power amplifier circuit and the digital-to-analog converter are configured to operate in a class-H fashion.

28. The apparatus of claim 26, wherein:
the scaling circuit is configured to provide the first voltage, the second voltage, and the third voltage such that a summation of the first voltage and the third voltage reduced by the second voltage is approximately equal to an average of the common-mode reference voltage and the common-mode output voltage.

29. The apparatus of claim 28, wherein the scaling circuit comprises:
a first voltage divider comprising:
a first resistor connected between the common-mode reference voltage and the body terminals of the second pair of resistors; and
a second resistor connected between the body terminals of the second pair of resistors and a ground, the first resistor and the second resistor having substantially similar resistances;
a second voltage divider comprising:
another first resistor connected between the common-mode output voltage and the body terminals of the first pair of resistors; and
another second resistor connected between the body terminals of the first pair of resistors and the ground, the other first resistor and the other second resistor having substantially similar resistances; and
an electrical connection between the common-mode reference voltage and the body terminals of the third pair of resistors.

30. The apparatus of claim 28, wherein the scaling circuit comprises:
a first electrical connection between the body terminals of the first pair of resistors and a ground;
a second electrical connection between the body terminals of the second pair of resistors and the ground; and
a voltage divider comprising:
a first resistor connected between the common-mode output voltage and the body terminals of the third pair of resistors; and
a second resistor connected between the body terminals of the third pair of resistors and the common-mode reference voltage, the first resistor and the second resistor having substantially similar resistances.

* * * * *